(12) United States Patent
Tseng et al.

(10) Patent No.: US 7,834,070 B2
(45) Date of Patent: Nov. 16, 2010

(54) HALOGEN-FREE AND THERMAL RESISTANT COMPOSITION

(75) Inventors: Feng-Po Tseng, Taoyuan County (TW);
Jung-Mu Hsu, Penghu County (TW);
Jing-Pin Pan, Hsinchu Hsien (TW);
Tzong-Ming Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/878,099

(22) Filed: Jul. 20, 2007

(65) Prior Publication Data

US 2008/0146706 A1    Jun. 19, 2008

(30) Foreign Application Priority Data

Dec. 14, 2006  (TW) ............................... 95146836 A

(51) Int. Cl.
| | | |
|---|---|---|
| C07D 209/48 | (2006.01) | |
| C08K 5/3477 | (2006.01) | |
| C08K 5/07 | (2006.01) | |
| B60C 1/00 | (2006.01) | |
| C08F 8/30 | (2006.01) | |
| H01B 3/40 | (2006.01) | |
| C07F 9/659 | (2006.01) | |
| B32B 15/00 | (2006.01) | |

(52) U.S. Cl. .................. 524/94; 524/101; 524/492; 524/555; 523/451; 523/452; 523/455; 428/209

(58) Field of Classification Search .............. 524/101, 524/94, 309, 492, 555; 523/451, 452, 455; 523/124; 428/209
See application file for complete search history.

(56) References Cited

U.S. PATENT DOCUMENTS

| | | | | |
|---|---|---|---|---|
| 5,648,432 A | * | 7/1997 | Pater et al. | 525/421 |
| 5,932,637 A | * | 8/1999 | Ito et al. | 523/451 |
| 6,217,987 B1 | * | 4/2001 | Ono et al. | 428/209 |
| 6,359,039 B1 | * | 3/2002 | Chen et al. | 523/454 |
| 2006/0116476 A1 | * | 6/2006 | Cheng | 525/120 |

FOREIGN PATENT DOCUMENTS

TW            466265         4/1987

OTHER PUBLICATIONS

English language translation of TW 466265 "High-Performance Adhesive Compositions" Chen Jr-Chiang, et al. published Dec. 2001.*

Han et al, Journal of Applied Polymer Science, "Interpenetrating polymer networks of bismaleimide and polyurethane-crosslinked epoxy" vol. 70, Issue 3, Oct. 17, pp. 529-539 (1998).*

* cited by examiner

*Primary Examiner*—Vasu Jagannathan
*Assistant Examiner*—Alexander C Kollias
(74) *Attorney, Agent, or Firm*—Birch, Stewart, Kolasch & Birch, LLP

(57) ABSTRACT

The invention provides a halogen-free and thermal resistant composition, including a mixture of bismaleimide and maleimide with molar ratio of 99:1-50:50; a barbituric acid, wherein the molar ratio of the mixture and the barbituric acid is 93:7-80:20; and an epoxy resin, wherein (the mixture with the barbituric acid) and the epoxy resin have a weight ratio of 5:95 to 50:50. The mixture undergoes reaction at 110-130° C. for about 2~7 hours to form a maleimide modified epoxy resin. The procedure of forming the composition is solvent-free, thereby providing improved integrity for electronic packaging, lower curing temperature, and a simplified process.

14 Claims, No Drawings

HALOGEN-FREE AND THERMAL RESISTANT COMPOSITION

BACKGROUND OF THE INVENTION

1. Field of the Invention

The present invention relates to a halogen-free and thermal resistant composition and in particular to its application of printed circuit board, IC packaging, LED packaging, or the likes.

2. Description of the Related Art

In recent years, consumer demand for the quality and quantity of electronic products, specifically, light, thin, short, and small products, has been accelerated by huge investments in the optoelectronic industry. One major development in electronic products is high density packaging, where tape automated bonding (TAB) and chip on film (COF) technologies applied in consumer electronics, mainframe and servers, liquid crystal displays, and IC cards. Flexible printed circuit board (FBC) can be applied in notebook, the automobile industry, the telecommunication industry, and/or lead frame tapes. TAB, COF, and FBC require a solder process to adhere the electronic devices to the printed circuit board. The operation temperature in solder process may reach 288° C. or above, in this situation, the thermal resistant packaging material can improve the dimensional stability and reduce inaccurate alignment of the circuits. Additionally, the increase of layers in integrated circuit will raise the device temperature when electrified, such that the adhesive and the packaging materials with high $T_g$ are needed to improve the manipulation stability of the electronic device.

Conventionally, the adhesive agent used in multi-layered flexible printed circuit board or multi-layered TAB is acrylic resin or epoxy resin, however, their thermal resistant and chemical resistant properties are poor than polyimide (PI). For strengthening thermal resistant and chemical resistant properties of the epoxy resin, bismaleimide is blended thereto. The blending resin is brittle and then further needs rubber to enhance toughness. Unfortunately, this mixture cannot be coated homogeneously due to phase separation.

For solving the described problem, the inventor previously patented Taiwan patent No. 466265 in 1998. In this patent, the adhesive agent composition comprises bismaleimide, barbituric acid, and epoxy resin. The polymerization of the composition requires a high boiling point solvent such as γ-butyrolactone that cannot be fully removed after polymerization. The residue solvent will degrade the quality of the electronic devices it is being used in.

BRIEF SUMMARY OF THE INVENTION

The invention provides a halogen-free and thermal resistant composition, comprising a mixture comprising a bismaleimide and a maleimide, wherein the bismaleimide and the maleimide have a molar ratio of 99:1 to 50:50, a barbituric acid, wherein the mixture and the barbituric acid have a molar ratio of 93:7 to 80:20, and an epoxy resin, wherein (the mixture with the barbituric acid) and the epoxy resin have a weight ratio of 5:95 to 50:50.

The described halogen-free and thermal resistant composition is applied in printed circuit board or adhesive agent of IC packaging, LCD packaging, LED packaging, or polymer.

A detailed description is given in the following embodiments.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The invention provides a halogen-free and thermal resistant composition, comprising a mixture comprising a bismaleimide and a maleimide, wherein the bismaleimide and the maleimide have a molar ratio of 99:1 to 50:50, a barbituric acid, wherein the mixture and the barbituric acid have a molar ratio of 93:7 to 80:20, and an epoxy resin, wherein (the mixture with the barbituric acid) and the epoxy resin have a weight ratio of 5:95 to 50:50. The bismaleimide is represented by formula (I):

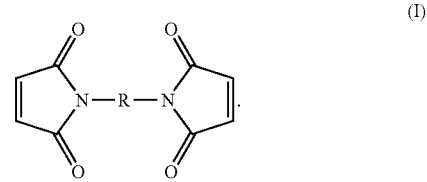

R comprises

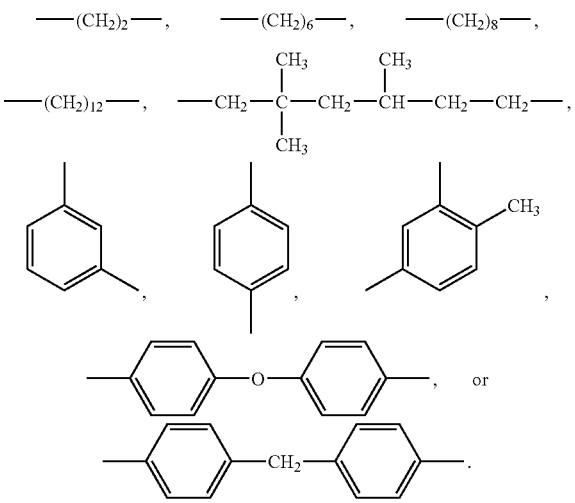

The maleimide comprises N-phenylmaleimide, N-(o-methylphenyl)maleimide, N-(m-methylphenyl)maleimide, N-(p-methylphenyl)maleimide, N-cyclohexylmaleimide, maleimide, maleimidophenol, maleimidobenzocyclobutene, phosphorous-containing maleimide, phosphonate-containing maleimide, siloxane-containing maleimide, N-(4-tetrahydropyranyl-oxyphenyl)maleimide; or 2,6-xylylmaleimide. Because the maleimide is liquid and has similar structure with the bismaleimide, it can improve the bismaleimide solubility. Note that bismaleimide and maleimide are equally important. If maleimide is absent, a high boiling point solvent will be necessary for polymerization. If bismaleimide is absent, a linear polymer formed by maleimide will not interpenetrate with the epoxy resin.

The polymerization of the maleimide and the bismaleimide is used barbituric acid (BTA) as thermal initiator. The barbituric acid is represented by formula (II):

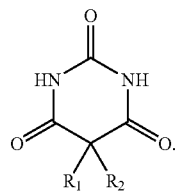

(II)

$R_1$ and $R_2$ are each independently, include:

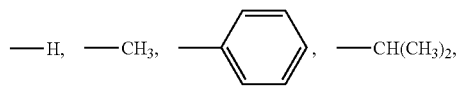

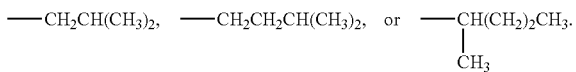

In addition to maleimide, bismaleimide, and barbituric acid, the composition of the invention also comprises epoxy resin. In an embodiment of the invention, the epoxy resin is glycidyl ether of novolac, tetraglycidylmethylenedianiline, diglycidyl ortho-phthalate, diglycidyl ether of bisphenol A, or epoxy cresol novolac. Herein the epoxy resin acts as a solvent, thereby eliminating shortcomings of a high boiling point solvent such as γ-butyrolactone. The described mixture forms maleimide modified epoxy resin by reacting about 2-7 hours at a temperature of 110-130° C. After polymerization, the mixture will form an interpenetrating copolymer. The copolymer of the maleimide and the bismaleimide will not crosslink to the epoxy resin, but the copolymer and the epoxy resin will interpenetrate to each other to form the non-halogen and thermal resistant composition of the invention.

0.5-1.5 parts by weight of a catalyst, 30 to 70 parts by weight of curing agent, and 100 to 300 parts by weight of inorganic powder may be added to 100 parts by weight of the described non-halogen and thermal resistant composition to form material used in printed circuit board. The catalyst may comprise borontrifluoride monoethylamine ($BF_3 \cdot MEA$) or 1-cyanoethyl-2-ethyl-4-methyl-imidazole (2E4Mz-CN), and so on. The curing agen may comprise 1,2-ethylenediamine, meta-diaminobenzene, para-diaminobenzene, methyl tetrahydrophthalic anhydride (MTHPA), methyl hexahydrophthalic anhydride (MHHPA), 4,4'-diamino-diphenyl sulfone (DDS), or polythiol, and so on. The inorganic powder, enhancing the flame retardant capability of the composition, comprises aluminum hydroxide, aluminum oxide, silicone oxide, or combinations thereof.

50-300 parts by weight of carboxyl terminated butadiene acrylonitrile (CTBN) can be further added to improve the toughness of the described composition. CTBN can be dissolved in low boiling point solvent such as acetone or methyl ethyl ketone. While the composition is mixed with the CTBN solution, the solvent can be completely removed by low temperature heating to prevent influence of the composition. The composition combination of the invention and the CTBN solution can be applied in IC packaging, LCD packaging, LED packaging, or polymer adhesive agents. The polymer may include polyimide, polyimide ether, polyamide ester, polyamide imide, liquid crystal polymer, poly(ethylene terephthalate), or combinations thereof.

The composition of the invention is halogen-free, thereby environmentally friendly. The bismaleimide structure increases the Tg and thermal retardant of the compositions, that is solvent-free or solvent-less, thus also environmentally friendly. Because the thermal resistant composition of the invention is free of high boiling point solvent, the composition will form a high quality and free-bubble material after high temperature baking. Electronic devices which utilize the thermal resistant composition of the invention have higher packaging integrity, lower curing temperature, and a more simplified manufacturing process.

EXAMPLES AND COMPARATIVE EXAMPLES

Comparative Example 1

Taiwan Patent No. 466265

35.80 g of bismaleimide and 1.28 g of barbituric acid were dissolved in 148.32 g of γ-butyrolactone and then reacted for 3 hours at 130° C. 20 g of the product from the described reaction, 16 g of the epoxy resin, 2.99 g of MTHPA, 0.10 g of 2E4Mz-CN, and 47.59 g of CTBN solution (20% solid content in methyl ethyl ketone) were mixed together by stirring to form an epoxy resin based adhesive agent.

The described adhesive agent was homogeneously coated on the surface of a polyimide film, then pre-baked for 2-4 minutes in 150° C., and then laminated with 1 oz copper foil in the condition of 100 cm/min at 100° C. Next, the semi-finished product was post-cured at 180° C. for 2 hours to form the sandwich-like product of polyimide/adhesive agent/copper foil. The sandwich-like product was processed by hot laminated, exposed, developed, and etched. The dry film was removed to form a ⅛ inch copper circuit. The properties such as peeling strength, thermal resistant, chemical resistant, and delamination were measured.

Example 1

35.80 g of bismaleimide and 1.28 g of barbituric acid were dissolved in 148.32 g of epoxy resin without solvent, and reacted for 3 hours at 130° C. 20 g of the modified epoxy resin, 2.99 g of MTHPA, 0.10 g of 2E4Mz-CN, and 47.59 g of CTBN solution (20% solid content in methyl ethyl ketone) were mixed together by stirring to form an epoxy resin based adhesive agent.

The described adhesive agent is homogeneously coated on the surface of a polyimide film, then pre-baked for 2-4 minutes in 150° C., and then laminated with 1 oz copper foil in the condition of 100 cm/min at 100° C. Next, the semi-finished product was post-cured at 180° C. for 2 hours to form the sandwich-like product of polyimide/adhesive agent/copper foil. The sandwich-like product was processed by hot laminated, exposed, developed, and etched. The dry film was removed to form a ⅛ inch copper circuit. The properties such as peeling strength, thermal resistant, chemical resistant, and delamination were measured as shown in Table 1.

TABLE 1

| Test condition | Peeling strength (lb/in) | | Circuit delamination or peeling | |
|---|---|---|---|---|
| | Example 1 | Comparative Example 1 | Example 1 | Comparative Example 1 |
| Solder dipping in 288° C. for 0 minute | 9.8 | 9.8 | No delamination | No delamination |
| Solder dipping in 288° C. For 1 minute | 9.6 | 9.7 | No delamination | No delamination |
| Solder dipping in 288° C. for 2 minutes | 9.4 | 9.2 | No delamination | No delamination |
| Solder dipping in 288° C. for 3 minutes | 9.4 | 8.9 | No delamination | Delamination |
| Solder dipping in 288° C. for 4 minutes | 9.3 | 8.3 | No delamination | Delamination |
| Solder dipping in 288° C. for 5 minutes | 9.3 | 7.1 | No delamination | Delamination |
| Dipping in methyl ethyl ketone for 0 minute | 9.8 | 9.8 | No peeling | No peeling |
| Dipping in methyl ethyl ketone for 1 minutes | 9.8 | 9.8 | No peeling | No peeling |
| Dipping in methyl ethyl ketone for 2 minutes | 9.7 | 9.4 | No peeling | No peeling |
| Dipping in methyl ethyl ketone for 3 minutes | 9.7 | 8.6 | No peeling | No peeling |
| Dipping in methyl ethyl ketone for 4 minutes | 9.6 | 7.8 | No peeling | No peeling |
| Dipping in methyl ethyl ketone for 5 minutes | 9.6 | 6.9 | No peeling | Peeling |

Referring to Table 1, with the polymerization of the invention not requiring additional solvent such as γ-butyrolactone (boiling point of 204-205° C.), the adhesive agent is free of residue solvent after curing. In addition, copper circuit utilizing the adhesive agent of the invention has relatively better peeling strength in thermal condition and better chemical resistant such as solvent resistant.

Example 2

5 g of modified epoxy resin (epoxy resin EPON-828 from SHELL CHEMICAL Co. further containing 5% mixture of bismaleimide and maleimide), 1.5 g of DDS, and 0.05 g BF3•MEA were added to a 100 mL beaker, stirred in room temperature for 10 minutes, vacuum degassed for 20 minutes, and cured in an oven for 120° C./1 hr and 200° C./2 hr. After curing, the $T_g$ (glass transition temperature) and $T_d$ (decomposition temperature, defined as temperature of 5% weight loss of resin) of the product was measured and tabulated in Table 2.

Example 3

5 g of modified epoxy resin (epoxy resin EPON-828 from SHELL CHEMICAL Co. further containing 10% mixture of bismaleimide and maleimide), 1.5 g of DDS, and 0.05 g BF3•MEA were added to a 100 mL beaker, stirred in room temperature for 10 minutes, vacuum degassed for 20 minutes, and cured in an oven for 120° C./1 hr and 200° C./2 hr. After curing, the Tg and Td of the product was measured and tabulated in Table 2.

Example 4

5 g of modified epoxy resin (epoxy resin EPON-828 from SHELL CHEMICAL Co. further containing 15% mixture of bismaleimide and maleimide), 1.5 g of DDS, and 0.05 g BF3•MEA were added to a 100 mL beaker, stirred in room temperature for 10 minutes, vacuum degassed for 20 minutes, and cured in an oven for 120° C./1 hr and 200° C./2 hr. After curing, the Tg and Td of the product was measured and tabulated in Table 2.

Comparative Example 2

5 g of epoxy resin EPON-828 from SHELL CHEMICAL Co., 1.5 g of DDS, and 0.05 g BF3•MEA were added to a 100 mL beaker, stirred in room temperature for 10 minutes, vacuum degassed for 20 minutes, and cured in an oven for 120° C./1 hr and 200° C./2 hr. After curing, the Tg and Td of the product was measured and tabulated in Table 2.

Example 5

5 g of modified epoxy resin (epoxy resin EPON-828 from SHELL CHEMICAL Co. further containing 5% mixture of bismaleimide and maleimide), 3.5 g of MHHPA, and 0.05 g catalyst (SA-102 from Air Products) were added to a 100 mL beaker, stirred in room temperature for 10 minutes, vacuum degassed for 20 minutes, and cured in an oven for 120° C./1 hr and 200° C./2 hr. After curing, the Tg of the product was measured and tabulated in Table 2.

Example 6

5 g of modified epoxy resin (epoxy resin EPON-828 from SHELL CHEMICAL Co. further containing 10% mixture of bismaleimide and maleimide), 3.5 g of MHHPA, and 0.05 g catalyst (SA-102 from Air Products) were added to a 100 mL beaker, stirred in room temperature for 10 minutes, vacuum degassed for 20 minutes, and cured in an oven for 120° C./1 hr and 200° C./2 hr. After curing, the Tg of the product was measured and tabulated in Table 2.

Example 7

5 g of modified epoxy resin (epoxy resin EPON-828 from SHELL CHEMICAL Co. further containing 15% mixture of bismaleimide and maleimide), 3.5 g of MHHPA, and 0.05 g catalyst (SA-102 from Air Products) were added to a 100 mL beaker, stirred in room temperature for 10 minutes, vacuum degassed for 20 minutes, and cured in an oven for 120° C./1 hr and 200° C./2 hr. After curing, the Tg of the product was measured and tabulated in Table 2.

Comparative Example 3

5 g of epoxy resin EPON-828 from SHELL CHEMICAL Co., 3.5 g of MHHPA, and 0.05 g catalyst (SA-102 from Air Products) were added to a 100 mL beaker, stirred in room temperature for 10 minutes, vacuum degassed for 20 minutes, and cured in an oven for 120° C./1 hr and 200° C./2 hr. After curing, the Tg of the product was measured and tabulated in Table 2.

TABLE 2

|  | Modified epoxy resin | 828 | DDS | MHHPA | BF$_3$·MEA | SA-102 | T$_g$ (° C.) | T$_d$ (° C.) |
|---|---|---|---|---|---|---|---|---|
| Example 2 | 5 g | — | 1.5 g | — | 0.05 g | — | 205 | 359 |
| Example 3 | 5 g | — | 1.5 g | — | 0.05 g | — | 226 | 371 |
| Example 4 | 5 g | — | 1.5 g | — | 0.05 g | — | 245 | 380 |
| Comparative Example 2 | — | 5 g | 1.5 g | — | 0.05 g | — | 180 | 345 |
| Example 5 | 5 g | — | — | 3.5 g | — | 0.05 g | 155 | — |
| Example 6 | 5 g | — | — | 3.5 g | — | 0.05 g | 167 | — |
| Example 7 | 5 g | — | — | 3.5 g | — | 0.05 g | 180 | — |
| Comparative Example 3 | — | 5 g | — | 3.5 g | — | 0.05 g | 145 | — |

Referring to Table 2, the epoxy resins modified by a mixture of bismaleimide and maleimide have higher T$_g$ and T$_d$. Accordingly, the modified resin of the invention is preferably utilized in adhesion and insulation of electronic material.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A halogen-free and thermal resistant composition, comprising:
   a mixture comprising a bismaleimide and a maleimide, wherein the bismaleimide and the maleimide have a molar ratio of 99:1 to 50:50;
   a barbituric acid, wherein the mixture and the barbituric acid have a molar ratio of 93:7 to 80:20; and
   an epoxy resin, wherein the mixture with the barbituric acid and the epoxy resin have a weight ratio of 5:95 to 50:50;
   wherein the mixture is polymerized by the barbituric acid in the epoxy resin to form a polymer;
   wherein the epoxy resin consists of glycidyl ether of novolac, tetraglycedylmethylenedianiline, diglycidyl ortho-phthalate, diglycidyl ether of bisphenol A, or epoxy cresol novloc;
   the polymer and the epoxy resin interpenetrate to each other to form the halogen-free and thermal resistant composition; and
   the halogen-free and thermal resistant composition is free of a solvent other than the epoxy resin.

2. The composition as claimed in claim 1, wherein the bismaleimide is represented by formula (I):

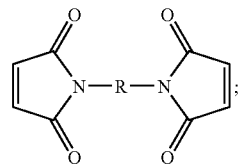

wherein R comprises

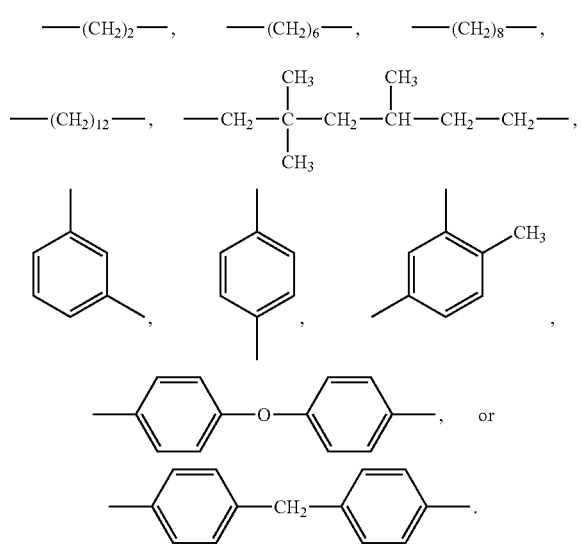

3. The composition as claimed in claim 1, wherein the maleimide comprises N-phenylmaleimide, N-(o-methylphenyl)maleimide, N-(m-methylphenyl)maleimide, N-(p-methylphenyl)maleimide, N-cyclohexylmaleimide, maleimide, maleimidophenol, maleimidobenzocyclobutene, phosphorous-containing maleimide, phosphonate-containing maleimide, siloxane-containing maleimide, N-(4-tetrahydropyranyl-oxyphenyl)maleimide, or 2,6-xylylmaleimide.

4. The composition as claimed in claim 1, wherein the barbituric acid is represented by formula (II):

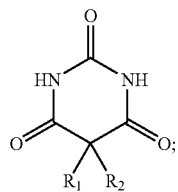

wherein the $R_1$ and $R_2$ each independently comprise:

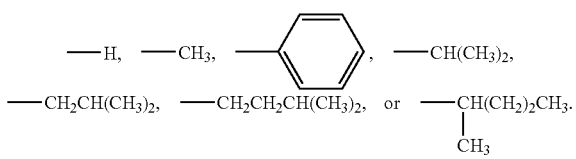

5. The composition as claimed in claim 1, wherein the composition is 100 parts by weight, and further comprising:

30 to 70 parts by weight of curing agent comprising 1,2-ethylenediamine, meta-diaminobenzene, para-diaminobenzene, methyl tetrahydrophthalic anhydride, methyl hexahydrophthalic anhydride, 4,4'-diamino-diphenyl sulfone, or polythiol;

0.5 to 1.5 parts by weight of catalyst comprising borontrifluoride monoethylamine or 1-cyanoethyl-2-ethyl-4-methyl-imidazole; and 100 to 300 parts by weight of inorganic powder comprising aluminum hydroxide, aluminum oxide, silicone oxide, or combinations thereof.

6. The composition as claimed in claim 5 is applied to a printed circuit board.

7. The composition as claimed in claim 5 further comprising 50 to 300 parts by weight of carboxyl-terminated-butadiene-acrylonitrile.

8. The composition as claimed in claim 7 is applied to an adhesive agent of IC packaging, LCD packaging, LED packaging, or polymer.

9. The composition as claimed in claim 8, wherein the polymer comprises polyimide, polyimide ether, polyamide ester, polyamide imide, liquid crystal polymer, poly(ethylene terephthalate), or combinations thereof.

10. The composition as claimed in claim 1, wherein the epoxy resin consists of glycidyl ether of novolac.

11. The composition as claimed in claim 1, wherein the epoxy resin consists of tetraglycedylmethylenedianiline.

12. The composition as claimed in claim 1, wherein the epoxy resin consists of diglycidyl ortho-phthalate.

13. The composition as claimed in claim 1, wherein the epoxy resin consists of diglycidyl ether of bisphenol A.

14. The composition as claimed in claim 1, wherein the epoxy resin consists of epoxy cresol novloc.

* * * * *